US009072192B2

(12) United States Patent
Lin et al.

(10) Patent No.: US 9,072,192 B2
(45) Date of Patent: Jun. 30, 2015

(54) COMPOSITE FLEXIBLE CIRCUIT PLANAR CABLE

(75) Inventors: Gwun-Jin Lin, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 225 days.

(21) Appl. No.: 13/563,989

(22) Filed: Aug. 1, 2012

(65) Prior Publication Data

US 2013/0341072 A1 Dec. 26, 2013

(30) Foreign Application Priority Data

Jun. 20, 2012 (TW) .............................. 101122046 A (51) Int. Cl.
*H01B 7/08* (2006.01)
*H05K 1/14* (2006.01)
*H01R 12/62* (2011.01)
*H05K 1/02* (2006.01)

(52) U.S. Cl.
CPC ....... *H05K 1/148* (2013.01); *H05K 2201/10356* (2013.01); *H01R 12/62* (2013.01); *H05K 1/0219* (2013.01); *H05K 2201/0715* (2013.01); *H05K 2201/09245* (2013.01)

(58) Field of Classification Search
CPC ....... H05K 1/00; H05K 1/0219; H05K 1/148; H05K 2201/0715; H05K 2201/09245; H05K 2201/10356; H01R 12/62
USPC ................. 174/254, 257, 261, 117 F, 117 FF; 257/730, 712
See application file for complete search history.

(56) References Cited

U.S. PATENT DOCUMENTS

| 5,083,238 | A * | 1/1992 | Bousman ..................... 361/788 |
| 7,180,001 | B1 | 2/2007 | Lin et al. |
| 8,427,380 | B2 * | 4/2013 | Farrell et al. ................. 343/705 |
| 8,477,511 | B2 * | 7/2013 | Lin et al. ....................... 361/772 |
| 8,698,044 | B2 * | 4/2014 | Burr et al. ..................... 219/211 |
| 2003/0146018 | A1 * | 8/2003 | Sinkunas et al. ............. 174/254 |

(Continued)

FOREIGN PATENT DOCUMENTS

| TW | 200717335 | 5/2007 |
| TW | I289372 B | 11/2007 |

(Continued)

OTHER PUBLICATIONS

Communication From the Taiwan Patent Office Regarding a Counterpart Foreign Application Dated (Taiwan Year 103) Mar. 18, 2014.

*Primary Examiner* — Yuriy Semenenko
(74) *Attorney, Agent, or Firm* — Rosenberg, Klein & Lee (57) ABSTRACT

A composite flexible circuit planar cable includes a flat cable, a first section, and a second section. The flat cable includes a plurality of straight line like parallel and non-jumping conductor lines. At least one jumping line is formed on the first section to interchangeably connect a selected conductive line of the first section to an another selected conductive line. The second section may also form at least one jumping line to interchangeably connect a selected conductive line of the second section to an another selected conductive line. Through such a jumping line, electrical connection can be formed between signal terminals and corresponding and interchanged signal terminals. The plurality of conductor lines of the flat cable includes at least a pair of differential signal conductor lines, a grounding line, and a power line.

17 Claims, 11 Drawing Sheets

(56) References Cited

U.S. PATENT DOCUMENTS

| | | |
|---|---|---|
| 2007/0068698 A1* | 3/2007 | Suekuni .................... 174/117 F |
| 2007/0074903 A1* | 4/2007 | Ide et al. ..................... 174/262 |
| 2007/0095557 A1 | 5/2007 | Wang |
| 2008/0196757 A1* | 8/2008 | Yoshimine ................. 136/244 |
| 2011/0094775 A1 | 4/2011 | Lin et al. |
| 2011/0189508 A1* | 8/2011 | Inoue et al. .................... 429/7 |
| 2012/0120607 A1* | 5/2012 | Millard et al. ................ 361/704 |

FOREIGN PATENT DOCUMENTS

| | | |
|---|---|---|
| TW | M341322 U | 9/2008 |
| TW | M350723 U | 2/2009 |
| TW | M379203 U1 | 4/2010 |
| TW | 201115596 A | 5/2011 |

* cited by examiner

COMPOSITE FLEXIBLE CIRCUIT PLANAR CABLE

BACKGROUND OF THE INVENTION

1. Field of the Invention

The present invention relates to a circuit flat cable, and in particular to a composite flexible circuit planar cable that combines a regular flexible planar cable, such as a flexible flat ribbon cable that is often referred to as flexible flat cable, and a regular circuit board.

2. The Related Arts

Processes for manufacturing a flexible circuit board are often classified as (1) forming a flexible board through image transfer, etching conductive layer, and laminating insulation layer, (2) directly printing conducive layer on a flexible board of insulation base material, and (3) forming a standard planar cable by stretching a plurality of parallel straight copper wires with a wind-up machine and laminating insulation layer. Dividing by functionality, there can be carrier boards, planar cables, or flexible circuit board featuring the functions of both carrying board and planar cable. Thus, a flexible circuit board is also referred to in different terms, such as flexible printed circuit board and flexible flat cable. These terms are actually directed to the same product. Based on the classification made according to manufacturing cost, a flexible board made through etching is the most expensive one and printing is the next expensive one, and the standard flexible flat cable is the cheapest one.

With increasing competition and mass production, to further reducing the manufacturing cost, the designs of internal components must be increasingly simplified. And, interconnection between modules can be done with a flexible flat cable to provide a path for signal transmission, and more importantly, to lower down the cost. However, the regular flexible flat cable often generates high frequency and high energy electromagnetic waves when transmitting signals, and also, the signal transmitted by the cable is easily subjected to interference caused by external high frequency noises, leading to distortion of the signal. Further, a flexible flat cable or a circuit board, when extending through a hole that is often put in movement, may generate high voltage static electricity. Under such a condition, fast and effective grounding is very vital.

To handle such drawbacks, a known solution is to coating a metal shielding layer on a surface of the flexible circuit board to shield external electromagnetic noises. However, such a metal shielding layer is effective in isolating the interference caused by external electromagnetic noises, but the metal shielding layer so coated is not effectively connected to ground of an electronic device, so that the performance of the metal shielding layer in shielding electromagnetic noises and eliminating static electricity is not good enough.

Thus, internal modules of a conventional electronic device often commonly use a conventional flexible circuit board made with an etching process as signal connection for easy grounding. However, the cost of the conventional flexible circuit board is much higher than the standard flexible flat cable. Further, one of the reasons that the standard flexible flat cable does not possess the function of electromagnetic noise shielding is that the manufacturing process is carried out by stretching and laminating copper wires so that the copper wires are of small width, making it difficult to control the impedance thereof. Thus, it is a major challenge for the industry to use regular flexible flat cable to replace the usage area of a fraction of the conventional flexible circuit board for reduction of cost and to provide effective shielding against electromagnetic noise and to provide impedance control for signal, and at the same time featuring a conductive connection structure for elimination of static electricity. Further, in some product applications, extension is made through a small hole or a bore of a hinge and tens of thousands of times of tests must be passed for bending durability. This is no exemption for applications of bundle like structure that is formed by partial slitting.

In addition, in an attempt of applying interconnection formed with standard flexible flat cable to provide a path for signal transmission for the purposes of lowering cost, when the positions of the corresponding signal terminals of the modules to be connected are different from each other, electrical connection will not be established between the positions of signal terminals and the positions of corresponding signal terminals.

SUMMARY OF THE INVENTION

To effectively overcome the previously discussed drawbacks, an object of the present invention is to provide a composite flexible circuit cable that combines a standard flexible flat cable and a conventionally etching-made circuit board.

Another object of the present invention is to provide a circuit flat cable that has wide applications, wherein a circuit board included is a rigid circuit board, a flexible circuit board, or a rigid-flex board. For a standard flexible flat cable or a flexible circuit board used, for easy extension through a small hole or a hinge bore, multiple slits may be made among signal lines for overlapping or being arranged in a bundle-like structure, so as to allow the standard flexible flat cable to easily extend a small hole or a hinge bore in an application and to allow of interchange of wires.

To achieve the above objects, the present invention provides a composite flexible circuit planar cable, which comprises a flat cable, a first section, and a second section. The flat cable comprises a plurality of straight line like parallel and non-jumping conductor lines.

The first section comprise a flat cable connection end, an external connection end, and a plurality of conductive lines extending and laid between the flat cable connection end and the external connection end. The flat cable connection end is connected to the first end of the flat cable and electrically connected to the conductor lines extending to the first end of the flat cable.

The first section may comprise at least one jumping line, which is formed on the first section. The jumping line interchangeably connects a selected conductive line of the first section to an another selected conductive line.

The second section comprises a flat cable connection end, an external connection end, and a plurality of conductive lines extending and laid between the flat cable connection end and the external connection end. The flat cable connection end is connected to the second end of the flat cable and electrically connected to the conductor lines extending to the second end of the flat cable.

The second section may also comprise at least one second jumping line, which is formed on the second section. The second jumping line interchangeably connects a selected conductive line of the second section to an another selected conductive line.

Further, the circuit board has two ends that are provided with corresponding but interchange signal terminals, whereby with a jumping line provided on the circuit board, electrical connection can be established between signal terminals and corresponding but interchanged signal terminals.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
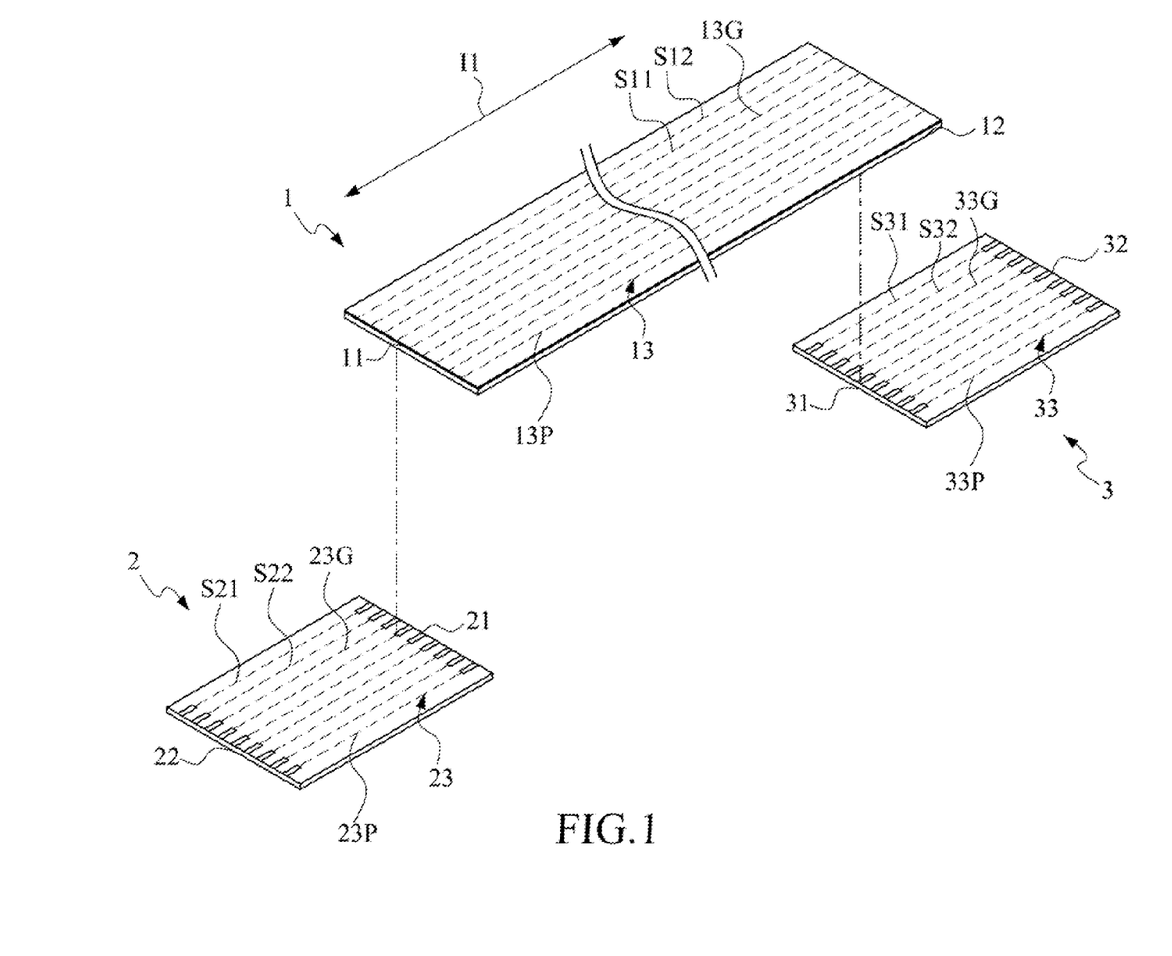
FIG. 1 is a perspective view showing a flat cable and first and second sections according to a first embodiment of the present invention in a separate manner.
Figure 2:
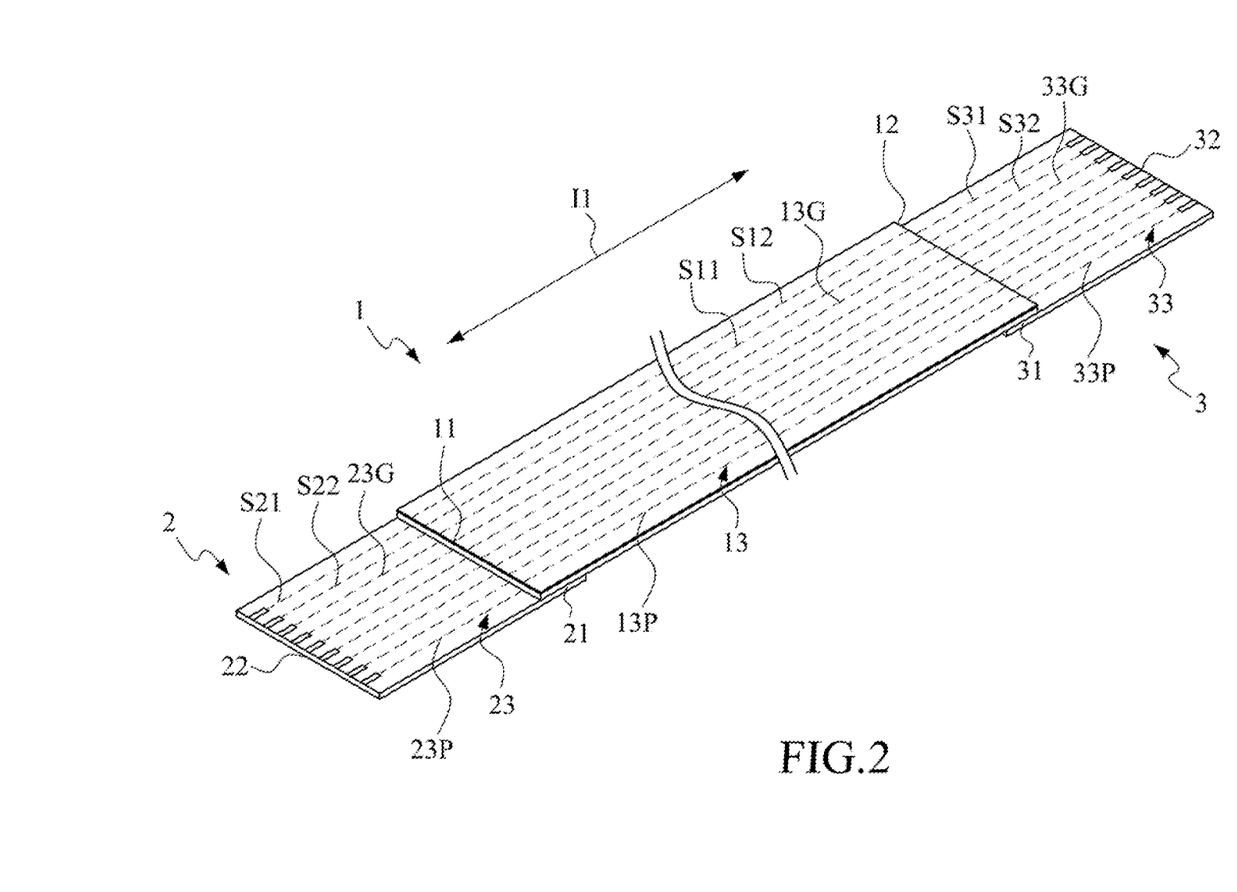
FIG. 2 is a perspective view showing the flat cable and the first and second sections according to the first embodiment of the present invention in an assembled form.

With reference to the drawings and in particular to FIGS. 1 and 2, FIG. 1 is a perspective view showing a flat cable and first and second sections according to a first embodiment of the present invention in a separate manner and FIG. 2 is a perspective view showing the flat cable and the first and second sections according to the first embodiment of the present invention in an assembled form. As shown in the drawings, the present invention provides a composite flexible circuit planar cable, which comprises a flat cable 1, a first section 2, and a second section 3.

The flat cable 1 has a first end 11 and a second end 12 and a plurality of straight line like parallel and non-jumping conductor lines 13 extending in a flat cable extension direction 11 between the first end 11 and the second end 12. The conductor lines 13 include at least a pair of differential signal conductor lines S11, S12, at least one grounding line 13G, and a power line 13P.

The first section 2 has a flat cable connection end 21, an external connection end 22, and a plurality of conductive lines 23 extending and laid between the flat cable connection end 21 and the external connection end 22. The flat cable connection end 21 of the first section 2 is connected to the first end 11 of the flat cable 1 and is electrically connected to the plurality of conductor lines 13 that extends to the first end 11 of the flat cable 1. The plurality of conductive lines 23 includes at least conductive line serving as a first grounding conductive line 23G, at least a pair of first differential signal lines S21, S22, and a first power line 23P. The first grounding conductive line 23G is electrically connected to the grounding line 13G of the flat cable 1. The first differential signal lines S21, S22 are electrically connected to the differential signal conductor lines S11, S12 of the flat cable 1. The first power line 23P is electrically connected to the power line 13P of the flat cable 1. The first section 2 can be one of a single-sided circuit board, a double-sided circuit board, and a multilayer circuit board.

The second section 3 has a flat cable connection end 31, an external connection end 32, and a plurality of conductive lines 33 extending and laid between the flat cable connection end 31 and the external connection end 32. The flat cable connection end 31 of the second section 3 is connected to the second end 12 of the flat cable 1 and is electrically connected to the plurality of conductor lines 13 extending to the second end 12 of the flat cable 1. The plurality of conductive lines 33 includes at least conductive lines serving as a third grounding conductive line 33G, at least a pair of second differential signal lines S31, S32, and the second power line 33P. The third grounding conductive lines 33G is electrically connected to the grounding line 13G of the flat cable 1. The second differential signal lines S31, S32 are electrically connected to the differential signal conductor lines S11, S12 of the flat cable 1. The second power line 33P is electrically connected to the power line 13P of the flat cable 1. The second section 3 can be one of a single-sided circuit board, a double-sided circuit board, and a multilayer circuit board.

Figure 3:
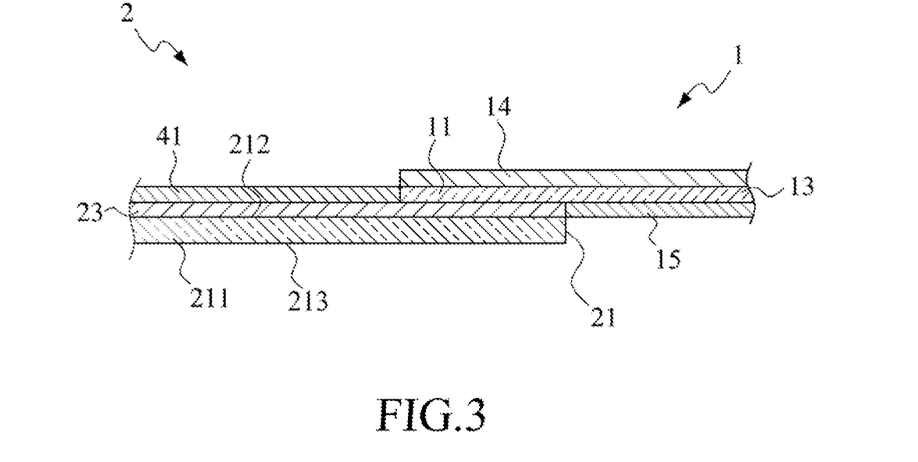
FIG. 3 is a cross-sectional view showing the structure of the first section that has an upper surface covered with a shielding layer.
Figure 4:
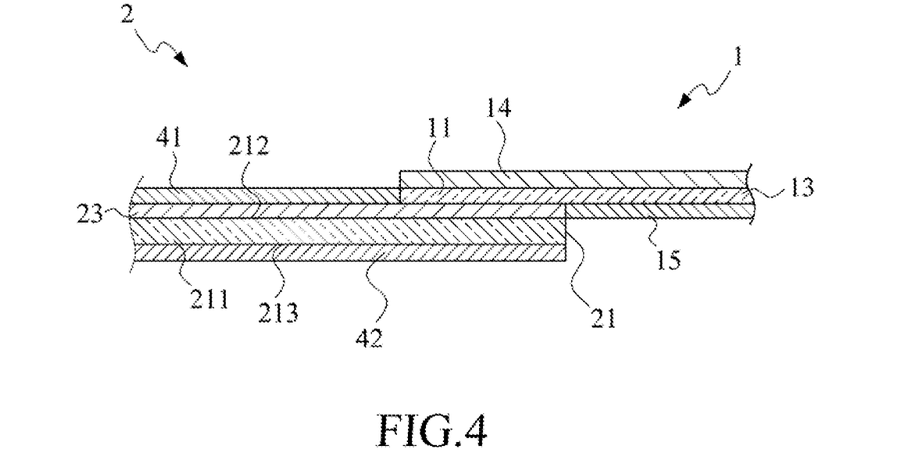
FIG. 4 is a cross-sectional view showing the structure of the first section that has an upper surface and a lower surface both covered with a shielding layer.

Referring to FIGS. 3 and 4, FIG. 3 is a cross-sectional view showing the structure of the first section that has an upper surface covered with a shielding layer and FIG. 4 is a cross-sectional view showing the structure of the first section that has an upper surface and a lower surface both covered with a shielding layer. As shown in the drawings, the flat cable 1 may further comprise an upper insulation layer 14 and a lower insulation layer 15. The upper insulation layer 14 and the lower insulation layer 15 are respectively formed on the upper surface and the lower surface of plurality of straight line like parallel and non-jumping conductor lines 13. The upper insulation layer 14 and the lower insulation layer 15 can be made of a material selected from insulation materials of PET (Polyethylene Terephthalate) or PI (Polyimide).

The first section 2 will be taken as an example for further explanation. In consideration of transmission performance of signal and reduction of interference during the transmission of signal, an upper shielding layer 41 (as shown in FIG. 3) may be set to cover the upper surface 212 of the circuit board 211 and the conductive lines 23, if desired, or alternatively, an upper shielding layer 41 and a lower shielding layer 42 are set to respectively cover the upper surface 212 of the circuit board 211 and the conductive lines 23 and the lower surface 213. It is certainly feasible to only cover the lower surface 213 of the circuit board 211 with a lower shielding layer 42 if desired.

Figure 5:
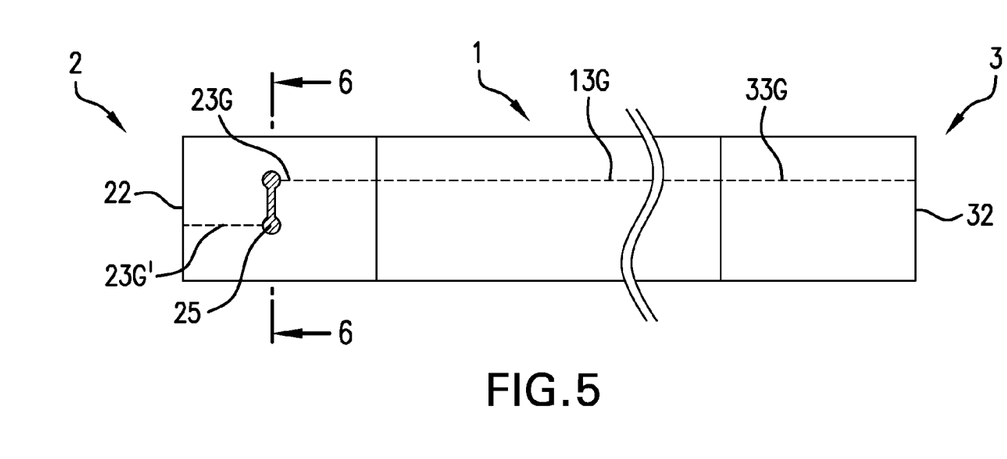
FIG. 5 is a schematic view showing a first embodiment according to the present invention.
Figure 6:
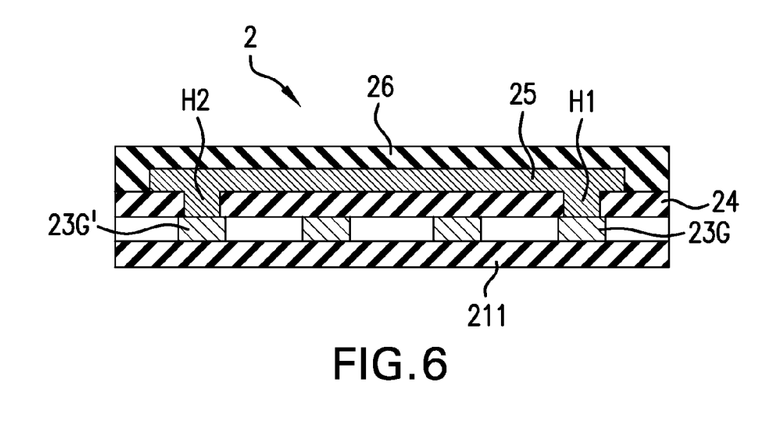
FIG. 6 is a cross-sectional view taken along line 6-6 of FIG. 5.

Referring to FIGS. 5 and 6, FIG. 5 is a schematic view showing a first embodiment according to the present invention and FIG. 6 is a cross-sectional view taken along line 6-6 of FIG. 5. Both the first section and the second section are single-sided boards. The first section 2 is taken as an example for explanation. The conductive lines 23 are laid on the circuit board 211. The upper surface of the conductive lines 23 is covered with an insulation layer 24. The insulation layer 24 forms a hole structure H1 at a location corresponding to the first grounding conductive line 23G and a hole structure H2 corresponding to the second grounding conductive line 23G'.

In a second embodiment according to the present invention, besides the first grounding conductive line 23G of the first section 2 is electrically connected to the grounding line 13G of the flat cable 1, the first grounding conductive line 23G of the first section 2 (which is defined herein as a "selected conductive line") is connected via a jumping line 25 to the second grounding conductive line 23G' (which is defined herein as "another selected conductive line"). The third grounding conductive line 33G of the second section 3 is electrically connected to the grounding line 13G of the flat cable 1. As shown in FIG. 6, the jumping line 25 is formed by applying sliver slurry coated wiring to the insulation layer 24 for interchangeably connecting the first grounding conductive lines 23G (the selected conductive line) to the second grounding conductive line 23G' (the another selected conductive line) and covered with a cover layer 26.

Figure 7:
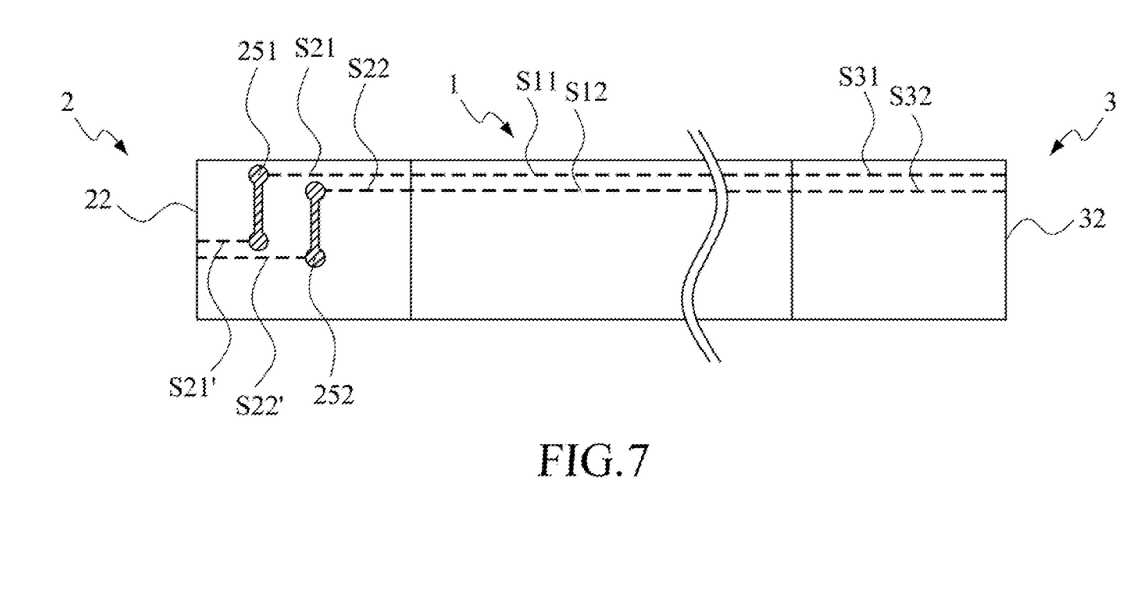
FIG. 7 is a schematic view showing a second embodiment of the present invention.

Referring to FIG. 7, a schematic view of a second embodiment of the present invention is shown. As shown in the drawing, in the second embodiment of the present invention, the first differential signal lines S21, S22 of the first section 2 are electrically connected to the differential signal conductor lines S11, S12 of the flat cable 1. The first differential signal lines S21, S22 (selected conductive lines) are respectively interchangeably connected via jumping lines 251, 252 to the first differential signal lines S21', S22' (another selected conductive lines). The second differential signal lines S31, S32 of the second section 3 are electrically connected to the differential signal conductor lines S11, S12 of the flat cable 1. This arrangement is applied to the situation where the positions of signal terminals of the first section 2 and the second section 3 do not correspond to each other and the jumping lines 251, 252 are useful to make the signals of the first section 2 jumping to another designated position of signal terminal.

Figure 8:
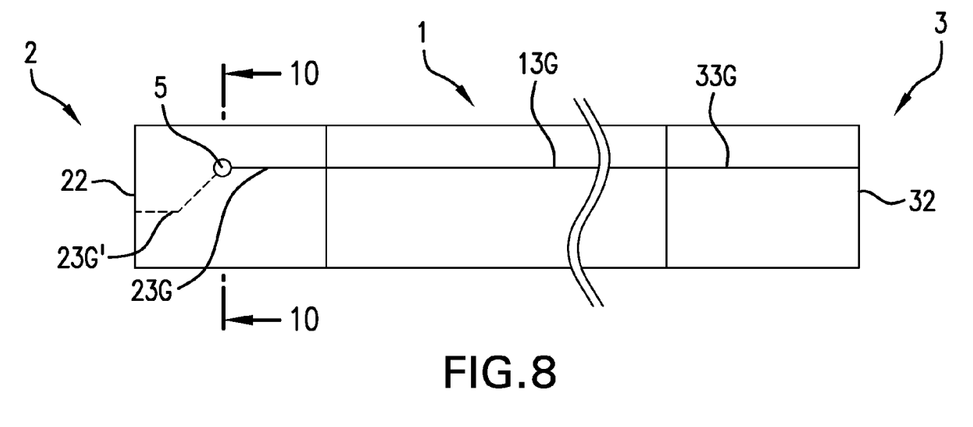
FIG. 8 is a top plan view showing a third embodiment according to the present invention.
Figure 9:
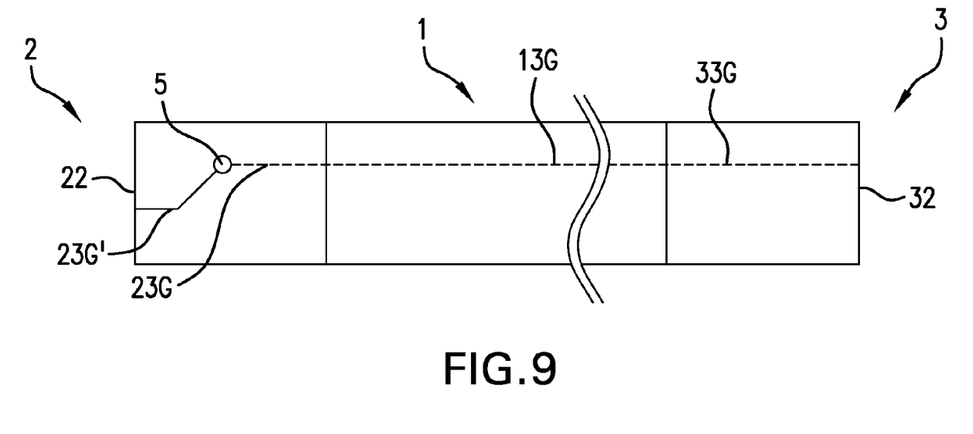
FIG. 9 is a rear view of the third embodiment of the present invention.
Figure 10:
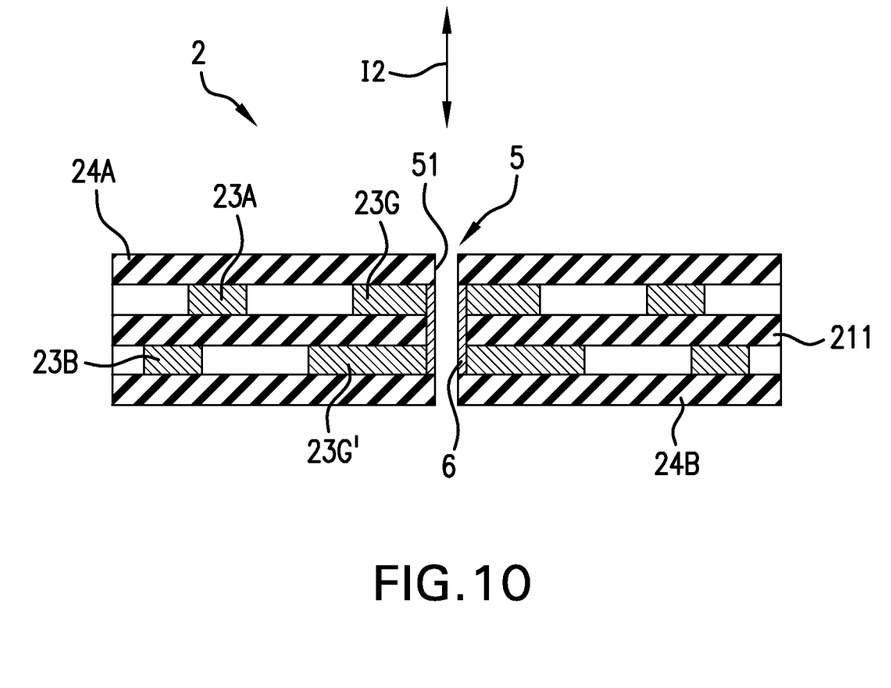
FIG. 10 is a cross-sectional view taken along line 10-10 of FIG. 8.

Referring to FIGS. 8-10, FIG. 8 is a top plan view showing a third embodiment according to the present invention; FIG. 9 is a rear view of the third embodiment of the present invention; and FIG. 10 is a cross-sectional view taken along line 10-10 of FIG. 8. Both the first section and the second section are double-sided boards. The first section 2 will be taken as an example for explanation. Upper wiring 23A is formed on an upper surface of a circuit board 211 and an upper insulation layer 24A is formed on a surface of the upper wiring 23A. Lower wiring 23B is formed on a lower surface of the circuit board 211 and a lower insulation layer 24B is formed on a surface of the lower wiring 23B.

The first section 2 comprises at least a via hole 5 extending in a perpendicular direction 12 through the upper insulation layer 24A, a first grounding conductive line 23G of the upper wiring 23A, the circuit board 211, a second grounding conductive line 23G' of the lower wiring 23B, the lower insulation layer 24B, and the lower conductor layer 44 and forming a hole wall structure 51. A conductive cover section 6 is set to cover the hole wall structure 51 of the via hole 5.

The first grounding conductive lines 23G of the upper wiring 23A and the second grounding conductive line 23G' of the lower wiring 23B are set in electrical connection with each other through the conductive cover section 6 of the via hole 5. The via hole 5 may realize jumping of conductive lines and the jumping helps improving utilization of electrical connection. The conductive cover section 6 can be formed with a process including coating of dry film, exposure, development, and etchings. The conductive material used for the conductive cover section 6 can be selected from copper, silver, gold, and a combination thereof.

In the third embodiment of the present invention, besides the first grounding conductive line 23G of the first section 2 being electrically connected to the grounding line 13G of the flat cable 1, the first grounding conductive line 23G of the first section 2 (the selected conductive line) is also interchangeably connected, through jumping via the via hole 5, to the second grounding conductive line 23G' (the another selected conductive line). The second grounding conductive line 33G of the second section 3 is electrically connected to the grounding line 13G of the flat cable 1.

Figure 11:
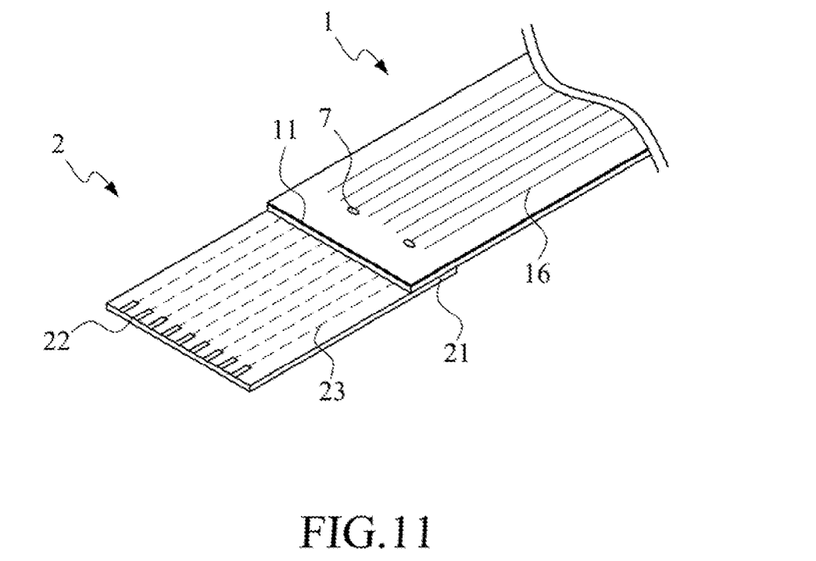
FIG. 11 is a schematic view showing the flat cable is slit to form a plurality of slit lines.
Figure 12:
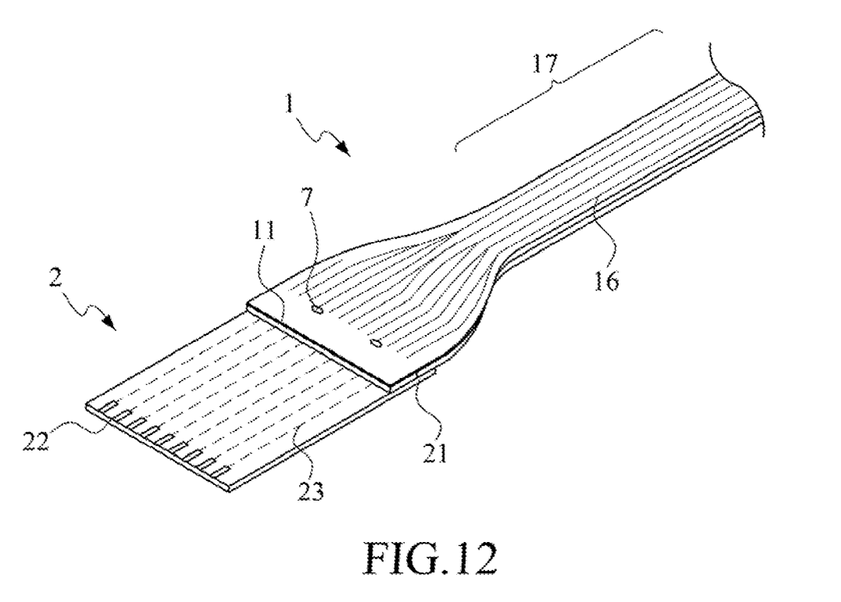
FIG. 12 is a schematic view showing the flat cable is slit and stacked.
Figure 13:
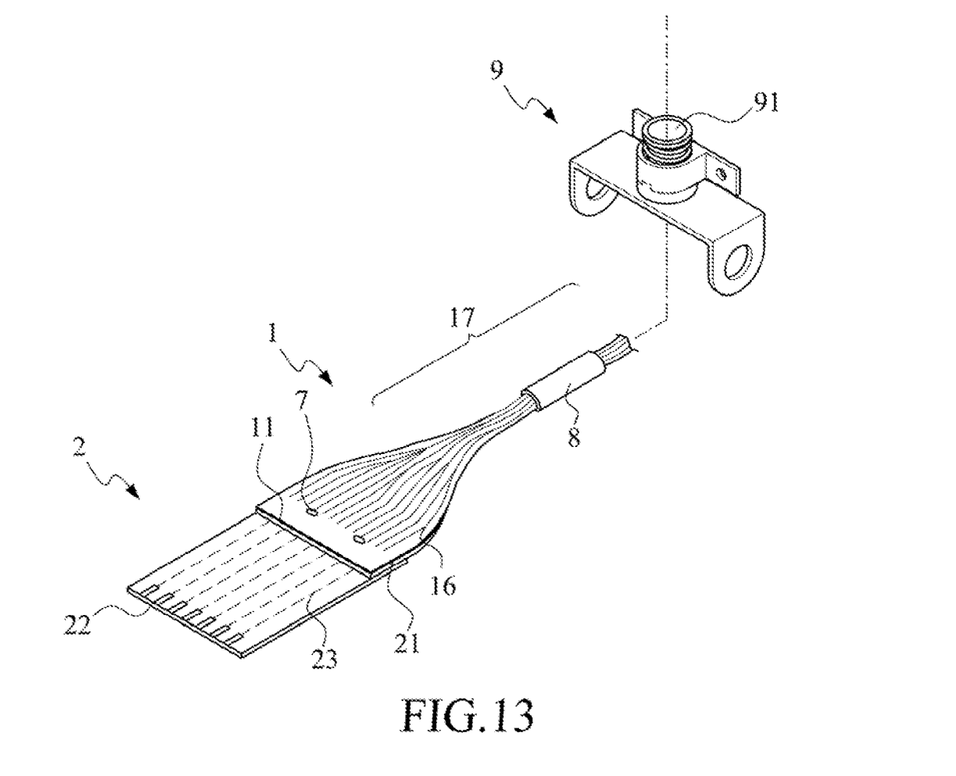
FIG. 13 is a schematic view showing the flat cable is slit and bundled.

Referring to FIGS. 11-13, FIG. 11 is a schematic view showing the flat cable is slit to form a plurality of slit lines; FIG. 12 is a schematic view showing the flat cable is slit and stacked; and FIG. 13 is a schematic view showing the flat cable is slit and bundled. The flat cable 1 can be slit along intervals between the conductor lines 13 to form a plurality of slit lines 16. Separation is then made of the plurality of conductor lines to form a plurality of conductor line segments. At least one tear protection hole 7 is formed at one end of the slit lines 16. The tear protection hole 7 functions to prevent undesired tearing of the flat cable.

The plurality of conductor line segments can be stacked to form a bundle structure 17 (as shown in FIG. 12), or alternatively, the plurality of conductor line segments, after being arranged in a bundle structure 17, can be wrapped with a wrapping member 8 (as shown in FIG. 13) in order to reduce the area of the flat cable. Besides improving design flexibility of circuit board, this also helps extending through a bore 91 of a hinge structure 9 or a small hole (not shown).

Figure 14:
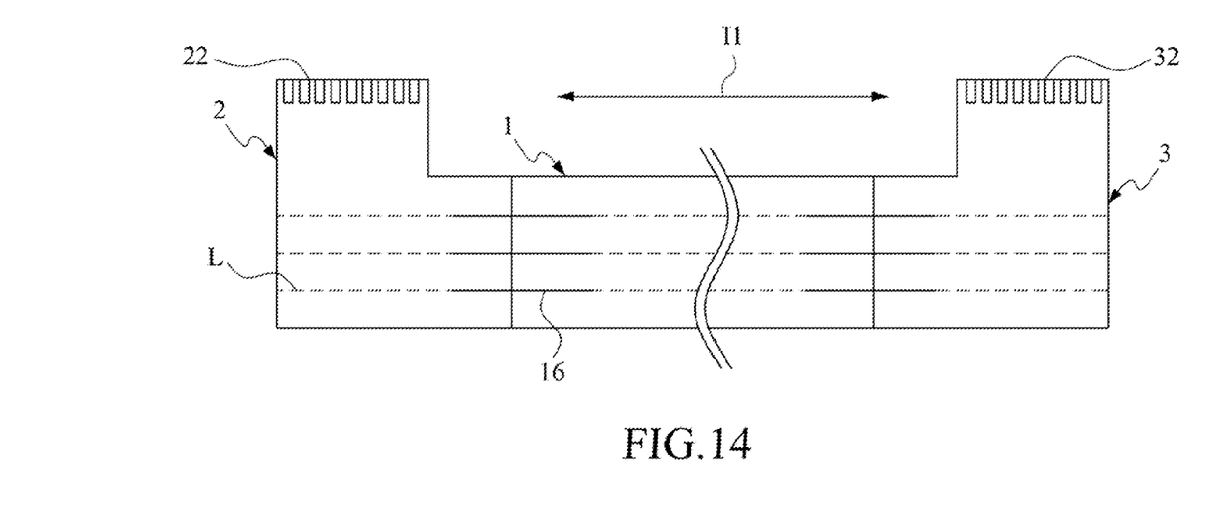
FIG. 14 is a schematic view showing a third embodiment according to the present invention.
Figure 15:
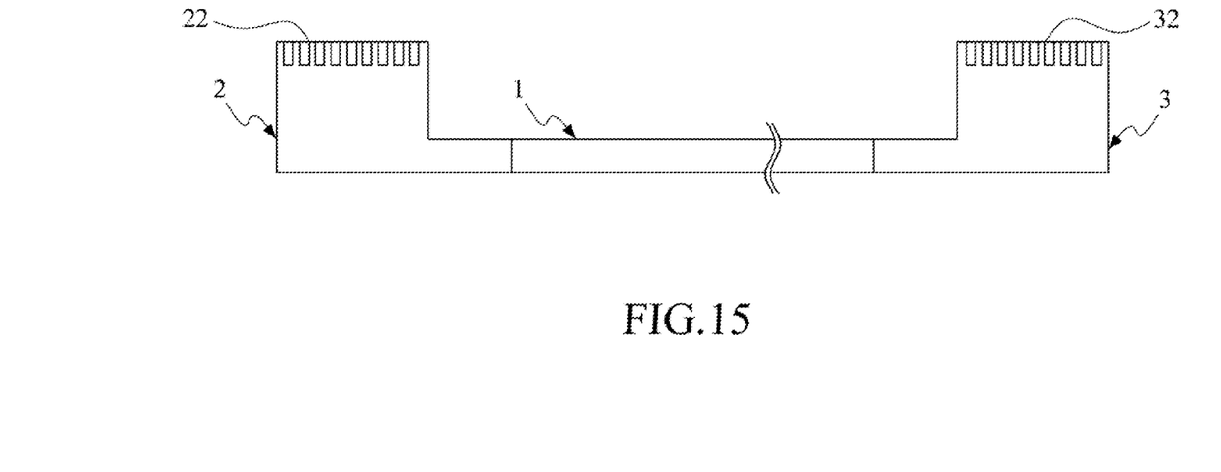
FIG. 15 is a schematic view showing a folded condition of the third embodiment according to the present invention.

Referring to FIGS. 14 and 15, FIG. 14 is a schematic view showing a third embodiment according to the present invention and FIG. 15 is a schematic view showing a folded condition of the third embodiment according to the present invention. The first section 2 has a flat cable connection end 21 and a plugging end 22 that are perpendicular to each other. The second section 3 has a flat cable connection end 31 and an external connection end 32 that are perpendicular to each other.

At least one fold line L is formed along the extension direction I1 of the flat cable 1 and extends through the flat cable 1, the first section 2, and the second section 3. At least one slit line 16 is formed along the fold line L and extends between the interfaces between the flat cable 1 and the first and second sections 2, 3. The fold line L and the slit line 16 allow the flat cable 1, the first section 2, and the second section 3 of the second embodiment to be stacked in a size-reduced structure (as shown in FIG. 15) so that the area occupied by the flat cable in a circuit design can be reduced. Further, this allows the flat cable to extend through a small hole a bore of a hinge structure.

Figure 16:
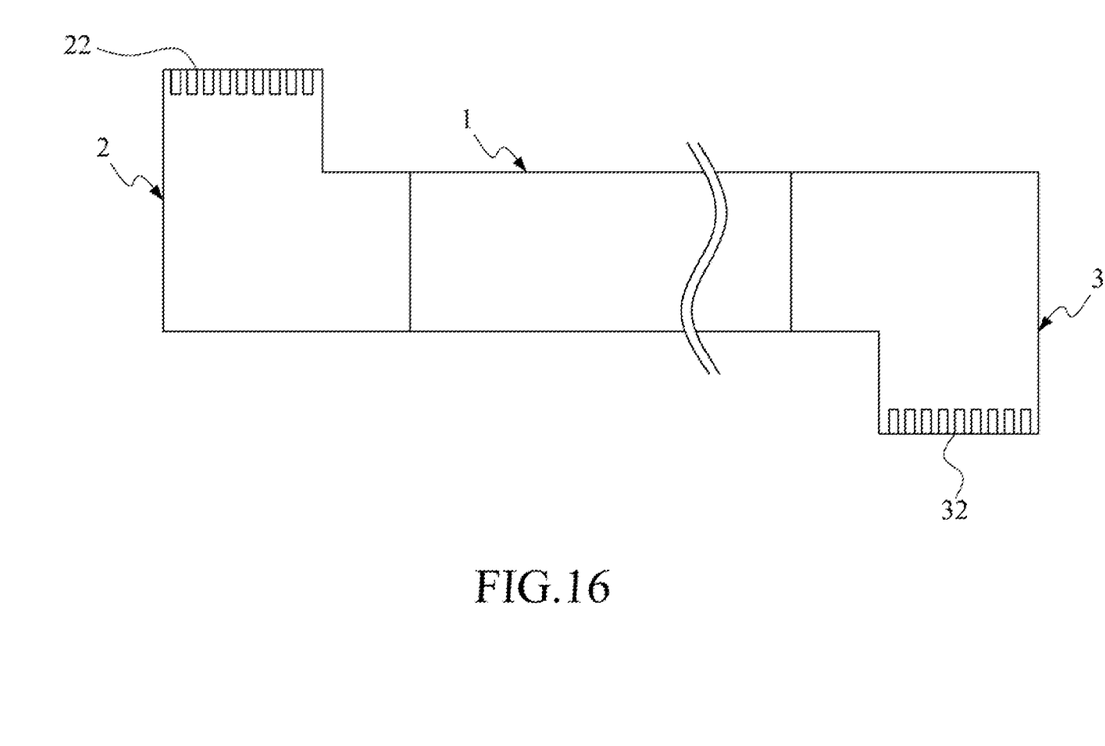
FIG. 16 is a schematic view showing a fourth embodiment according to the present invention.

Referring to 16, a schematic view showing a fourth embodiment according to the present invention is given. As shown in the drawing, the first section 2 has a flat cable connection end 21 and a plugging end 22 that are perpendicular to each other. The second section 3 has a flat cable connection end 31 and an external connection end 32 that are perpendicular to each other. The external connection end 22 of the first section 2 and the external connection end 32 of the second section 3 are set in opposite directions. In a practical application, the external connection end 22 of the first section 2 and the external connection end 32 of the second section 3 can be external connection terminals, insertion slots, connectors, soldering terminals, electronic components, or surface mounting components for connection with an external device (such as a main board of electronic device and liquid crystal display device).

It can be appreciated from the above description that the present invention provides a composite flexible circuit planar cable, which comprises a flat cable, a first section, and a second section, wherein the flat cable is a commercially available standard flexible flat cable and the first section and the second section can be selected from one of single-sided boards, double-sided board, and multilayer boards.

The present invention provides the following advantages:

(1) A standard flexible flat cable is provided for effecting signal connection sot that as compared to an arrangement that uses a flexible circuit board for transmission of signal, the present invention allows of reduction of manufacturing cost of electronic device.

(2) The present invention provides a shielding layer selectively covering the upper surface and the lower surface of the first section and the second section so as to provide improved electromagnetic shielding and elimination of static electricity.

(3) The present invention provides a combined flat cable structure of a bundle like standard flexible flat cable and a circuit board for wire extension through a hinge of an electronic device.

(4) The present invention provides the first section and the second section in such a way that the flat cable connection end and the external connection end arc pointing at different or identical directions so that a combined flat cable structure of a flexible flat cable and circuit board that uses such circuit boards provides line extension arrangement of multiple directions and a more appropriate use of space. Further, via hole technology may be used for wire jumping of conductor lines.

(5) The present invention provides a wire jumping arrangement, which comprises silver plate printing or a via hole that form in the first section or the second section a jumping line to interchangeably connect lines to proper positions of terminals thereby improving utilization of circuit connection.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A composite flexible circuit planar cable, comprising:
   a flat cable, having a first end, a second end, and a plurality of parallel and non-jumping conductor lines extending and laid in the form of a flat cable between the first end and the second end;
   a first section, having a flat cable connection end, an external connection end, and a first plurality of conductive lines extending and laid between the flat cable connection end and the external connection end, the flat cable connection end of the first section being connected to the first end of the flat cable and electrically connected to the conductor lines extending to the first end of the flat cable, each of said first plurality of conductive lines being positioned to define a first arrangement of said first plurality of conductive lines with said parallel and non jumping conductor lines; and
   a second section, having a flat cable connection end, an external connection end, and a second plurality of conductive lines extending and laid between the flat cable connection end and the external connection end, the flat cable connection end of the second section being connected to the second end of the flat cable and electrically connected to the conductor lines extending to the second end of the flat cable, each of said second plurality of conductive lines being positioned to define a second arrangement of said second plurality of conductive lines with said parallel and non-jumping conductor lines, said first arrangement being different from said second arrangement, wherein the first section comprises at least one jumping line, the jumping line interchangeably connecting a selected first conductive line of the first section to another selected conductive line of said flat cable;
   wherein the plurality of conductor lines of the flat cable comprise at least a pair of differential signal conductor lines, the first plurality of conductive lines of the first section comprising first differential signal lines corresponding to the differential signal conductor lines, the second plurality of conductive lines of the second section comprising second differential signal lines corresponding to the differential signal conductor lines; and
   wherein the plurality of conductor lines of the flat cable comprises at least one grounding line, the first plurality of conductive lines of the first section comprising a first grounding conductive line corresponding to the grounding line, the second plurality of conductive lines of the second section comprising a second grounding conductive line corresponding to the grounding line.

2. The composite flexible circuit planar cable as claimed in claim 1, wherein the plurality of conductor lines of the flat cable comprises at least one power line, the first plurality of conductive lines of the first section comprising a first power line corresponding to the power line, the second plurality of conductive lines of the second section comprising a second power line corresponding to the power line.

3. The composite flexible circuit planar cable as claimed in claim 1, wherein the jumping line comprises one of silver plate printing and a via hole.

4. The composite flexible circuit planar cable as claimed in claim 1, wherein the first section, the flat cable, and the second section comprise at least one slit line extending in an extension direction of the flat cable.

5. The composite flexible circuit planar cable as claimed in claim 4, wherein the flat cable comprises at least one bundle section between the first end and the second end.

6. The composite flexible circuit planar cable as claimed in claim 5, wherein the bundle section comprises a wrapping member for wrapping the bundle section.

7. The composite flexible circuit planar cable as claimed in claim 4, wherein the first section, the flat cable, and the second section comprise at least one fold line extending in the flat cable extension direction, whereby the first section, the flat cable, and the second section are foldable along the fold line.

8. The composite flexible circuit planar cable as claimed in claim 7, wherein the first section, the flat cable, and the second section, after being folded along the fold line, is subjected to bundling the flat cable with a wrapping member.

9. The composite flexible circuit planar cable as claimed in claim 1, wherein the flat cable is set to extend through one of a bore of a hinge structure and a small hole.

10. The composite flexible circuit planar cable as claimed in claim 1, wherein the external connection end of the first section and the external connection end of the second section comprise one of external connection terminal, insertion slot, connector, soldering terminal, electronic component, or surface mounting component.

11. The composite flexible circuit planar cable as claimed in claim 1, wherein the flat cable connection end and the external connection end of the first section are pointing at the same direction.

12. The composite flexible circuit planar cable as claimed in claim 1, wherein the flat cable connection end and the external connection end of the first section are pointing at directions that are perpendicular to each other.

13. The composite flexible circuit planar cable as claimed in claim 1, wherein the flat cable connection end and the external connection end of the second section are pointing at the same direction.

14. The composite flexible circuit planar cable as claimed in claim 1, wherein the flat cable connection end and the external connection end of the second section are pointing at directions that are perpendicular to each other.

15. The composite flexible circuit planar cable as claimed in claim 1, wherein the first section has an upper surface and a lower surface one of which comprises a shielding layer.

16. The composite flexible circuit planar cable as claimed in claim 1, wherein the second section has an upper surface and a lower surface one of which comprises a shielding layer.

17. The composite flexible circuit planar cable as claimed in claim 1, wherein the first section and the second section are selected from rigid circuit boards, flexible circuit boards, and rigid-flex boards.

* * * * *